US007065025B2

(12) United States Patent
Kiyose

(10) Patent No.: US 7,065,025 B2
(45) Date of Patent: Jun. 20, 2006

(54) PLL CIRCUIT

(75) Inventor: Masashi Kiyose, Gifu (JP)

(73) Assignee: Sanyo Electric Co., Ltd., Osaka (JP)

( * ) Notice: Subject to any disclaimer, the term of this patent is extended or adjusted under 35 U.S.C. 154(b) by 568 days.

(21) Appl. No.: 10/066,244

(22) Filed: Jan. 31, 2002

(65) Prior Publication Data
US 2002/0105882 A1    Aug. 8, 2002

(30) Foreign Application Priority Data
Feb. 5, 2001    (JP) .............................. 2001-028159

(51) Int. Cl.
G11B 7/00        (2006.01)
H03L 7/06        (2006.01)
(52) U.S. Cl. .............................. 369/53.34; 369/47.27; 327/147; 327/156
(58) Field of Classification Search ............ 331/2; 327/156, 157, 148; 369/47.27, 53.34
See application file for complete search history.

(56) References Cited

U.S. PATENT DOCUMENTS 5,072,195 A * 12/1991 Graham et al. ............ 327/156
5,075,639 A * 12/1991 Taya ............................. 331/2
5,657,359 A *  8/1997 Sakae et al. ............... 327/157
5,734,301 A *  3/1998 Lee et al. ................... 327/148
5,909,474 A *  6/1999 Yoshizawa .................. 327/156
6,693,862 B1* 2/2004 Shigemori ............... 369/47.31

* cited by examiner

Primary Examiner—Andrea Wellington
Assistant Examiner—Jorge L. Ortiz-Criado
(74) Attorney, Agent, or Firm—Fish & Richardson P.C.

(57) ABSTRACT

A PLL circuit for generating a clock signal using a reference signal, the frequency of which is relatively low. The PLL circuit includes a first loop circuit for generating a first clock signal which is synchronized with a first reference signal. A second loop circuit generates a second clock signal which is synchronized with a second reference signal. The frequency of the second reference signal is sufficiently lower than the frequency of the first reference signal. The first reference signal is compared with the first clock signal to generate a first control voltage. The second reference signal is compared with the second clock signal to generate a second control voltage. The second loop circuit generates the second clock signal in accordance with the first control voltage and the second control voltage.

10 Claims, 7 Drawing Sheets

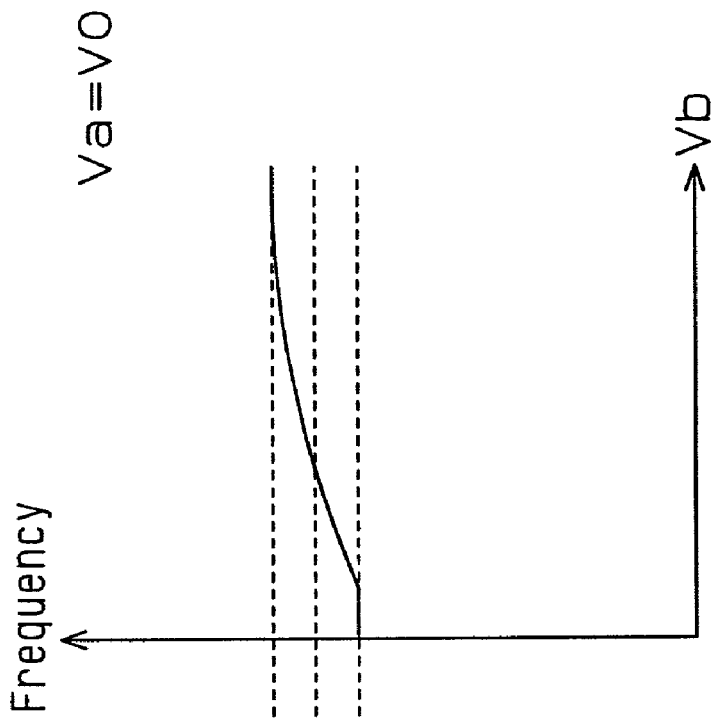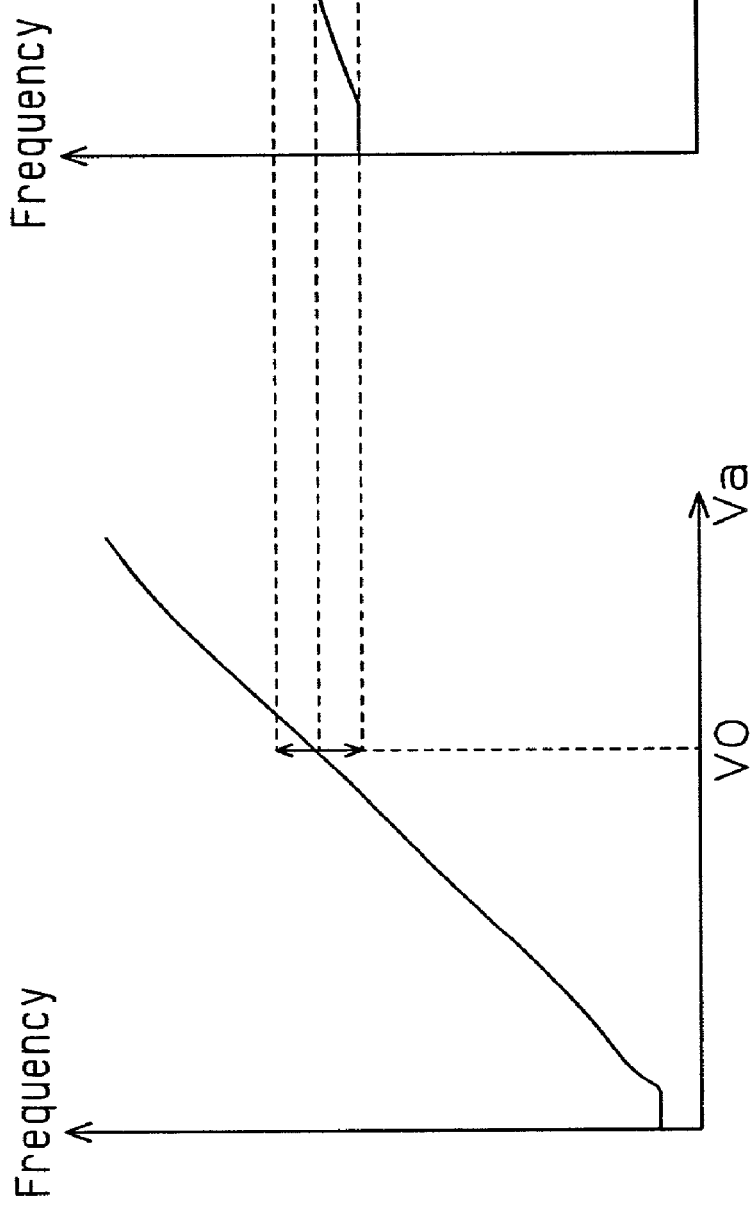
Fig.10A
Fig.10B

PLL CIRCUIT

BACKGROUND OF THE INVENTION

The present invention relates to a phase-locked loop (PLL) circuit, and more particularly, to a PLL circuit used, for example, to reproduce a write clock signal of an optical disc.

An optical disc is known as a recording medium that records data. For example, a digital versatile disc-recordable (DVD-R) is an optical disc that may be recorded by a user. The DVD-R typically includes a spiral pregroove (guide groove) and land prepits (hereafter referred to as LPPs) formed near the pregroove.

The pregroove wobbles along the optical disc. Wobble components include information related with absolute time (absolute position on the optical disc) and information related with the specification of the disc. Based on the absolute time information, data is recorded on the optical disc while recognizing the position of the recorded data on the optical disc.

The LPPs are formed at predetermined intervals along the pregroove. An LPP signal is generated in accordance with the reproduction of the LPPs. In accordance with the interval of the LPPs, the LPP signal has a pulse for every 16 pulses of a signal obtained from the wobble components (i.e., wobble signal).

To improve the accuracy for recording data to the optical disc, it is preferred that the timing for recording data to the optical disc be synchronized with the rotation of the optical disc. For example, data may be recorded in accordance with a clock signal obtained by reproducing a signal recorded on the optical disc. In this case, the area occupied by a single bit of recording data on the optical disc is always the same.

A phase-locked loop (PLL) circuit has been conventionally used. The PLL circuit has a phase comparator that compares a clock signal, which is generated by a voltage-controlled oscillator (VCO), with a pulse signal, which is to be synchronized with the clock signal. A voltage corresponding to the frequency difference and phase difference of the two signals is fed back to the VCO. The VCO then synchronizes the clock signal and the pulse signal.

Since the wobble signal facilitates synchronization, the wobble signal may be used by the PLL circuit to generate the clock signal in synchronism with the rotation of the optical disc.

To generate a clock signal that is further accurately synchronized with the rotation of the optical disc, it is preferred that the LPP signal be used instead of the wobble signal. However, the pulse cycle of the LPP signal is longer than that of the wobble signal. Thus, it is difficult for the PLL circuit to generate a clock signal that is accurately synchronized with the LPP signal.

The same problem occurs when the PLL circuit generates a clock signal that is to be synchronized with a signal having a relatively long pulse cycle (low frequency). It is difficult to synchronize such a long pulse cycle signal with the clock signal.

SUMMARY OF THE INVENTION

It is an object of the present invention to provide a PLL circuit that generates a clock signal synchronized with a signal that has a relatively low frequency.

To achieve the above object, the present invention provides a PLL circuit including a first loop circuit for generating a first clock signal which is synchronized with a first reference signal. The first reference signal is compared with the first clock signal to generate a first control voltage. A second loop circuit is connected to the first loop circuit to generate a second clock signal which is synchronized with a second reference signal. The second reference signal has a frequency which is sufficiently lower than the frequency of the first reference signal. The second reference signal is compared with the second clock signal to generate a second control voltage. The first loop circuit includes a first voltage controlled oscillator for generating the first clock signal in accordance with the first control voltage. The second loop circuit includes a second voltage controlled oscillator for generating the second clock signal in accordance with the first control voltage and the second control voltage.

A further perspective of the present invention is a PLL circuit including a first loop circuit for generating a first clock signal which is synchronized with a first reference signal. A second loop circuit is connected to the first loop circuit to generate a second clock signal which is synchronized with a second reference signal. The frequency of the second reference signal is lower than the frequency of the first reference signal. The first loop circuit includes a first frequency divider for generating a first divisional clock signal by dividing the first clock signal by a predetermined first frequency dividing ratio. A first phase comparator is connected to the first frequency divider to receive the first reference signal and the first divisional clock signal and generate a first comparison signal in accordance with the first reference signal and the first divisional clock signal. A first low-pass filter is connected to the first phase comparator to generate a first control voltage corresponding to the first comparison signal. A first voltage controlled oscillator is connected to the first low-pass filter to generate the first clock signal in accordance with the first control voltage. The second loop includes a second frequency divider for generating a second divisional clock signal by dividing the second clock signal by a predetermined second frequency dividing ratio. A second phase comparator is connected to the second frequency divider to receive the second reference signal and the second divisional clock signal and generate a second comparison signal in accordance with the second reference signal and the second divisional clock signal. A second low-pass filter is connected to the second phase comparator to generate a second control voltage corresponding to the second comparison signal. A second voltage controlled oscillator is connected to the first and second low-pass filters to generate the second clock signal in accordance with the first and second control voltages.

A further perspective of the present invention is a method for generating a clock signal using a first PLL circuit and a second PLL circuit connected to the first PLL circuit. The first PLL circuit includes a first voltage controlled oscillator, and the second PLL circuit includes a second voltage controlled oscillator. The method includes the steps of generating a first clock signal which is synchronized with a first reference signal, and generating a second clock signal which is synchronized with a second reference signal. The frequency of the second reference signal is lower than the frequency of the first reference signal. The step of generating the first clock signal includes generating a first control voltage by comparing the first reference signal and the first clock signal, and generating the first clock signal in accordance with the first control voltage. The step of generating the second clock signal includes generating a second control voltage by comparing the second reference signal and the second clock signal, and generating the second clock signal in accordance with the first control voltage and the second control voltage.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIGS. 10A and 10B are graphs illustrating the output characteristics of the VCO of FIG. 9.

DETAILED DESCRIPTION OF THE PREFERRED EMBODIMENTS

Figure 1:
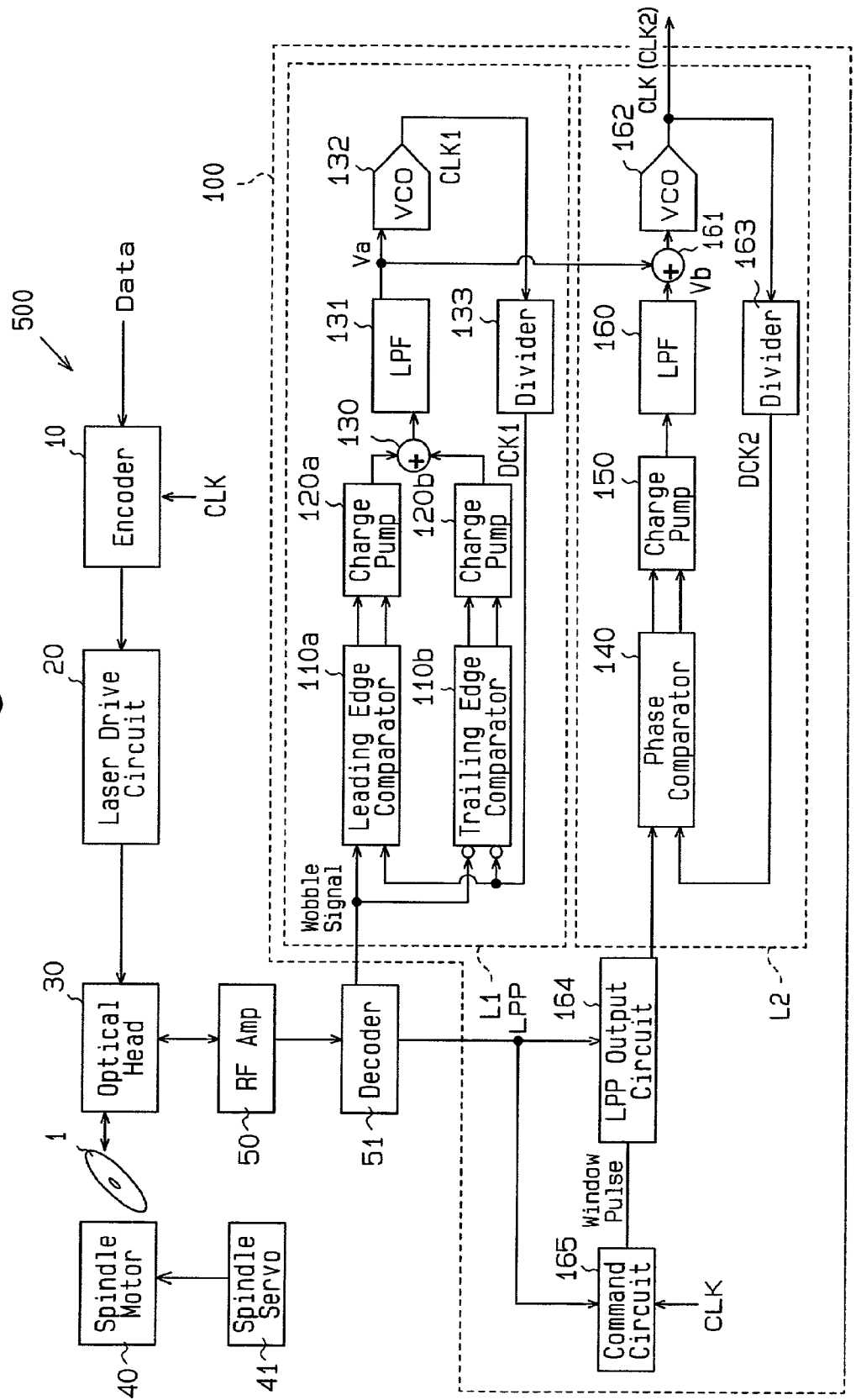
FIG. 1 is a schematic block diagram of an optical disc data recording device including a PLL circuit according to a first embodiment of the present invention.

In the drawings, like numerals are used for like elements throughout.

[First Embodiment]

FIG. 1 is a schematic block diagram of an optical disc data recording device 500 that includes a PLL circuit according to a first embodiment of the present invention. The PLL circuit is applied to a system clock signal generation circuit 100 of the data recording device 500.

An optical disc (DVD-R) 1 includes a spiral pregroove and land prepits (LPPs) formed near the pregroove. A wobble signal of the pregroove has a frequency of 140.6 kHz.

The LPPs are formed along the pregroove at predetermined intervals. An LPP signal generated from the LPPs has a cycle that is about 16 times longer than the wobble signal.

The data recording device 500 includes an encoder 10, which encodes data received from an external device into a predetermined format, a laser drive circuit 20, which generates a drive signal for outputting a laser beam corresponding to the data encoded by the encoder 10, and an optical head 30, which emits a laser beam to the optical disc 1 in accordance with the drive signal.

The optical head 30 includes a variable output laser beam source, which selectively irradiates the middle (recording layer) of the pregroove with a high output laser beam and a low output laser beam based on the recording data, and two reproduction laser beam sources, which irradiates the two sides of the pregroove with a low output laser beam. When recording data, the laser drive circuit 20 generates a drive signal of the variable output laser beam source.

Further, the optical head 30 includes light receiving elements for receiving the laser beam reflected by the optical disc 1. The light receiving elements include an element, which receives the reflection of the laser beam emitted from the variable output laser beam source to the center of the pregroove, and elements, which receive the reflection of the laser beam emitted to the sides of the pregroove from the reproduction laser beam sources. The data recording device 500 detects the wobble signal and the LPP signal based on the received laser beam reflections.

The data recording device 500 includes a spindle motor 40, which rotates the optical disc 1, and a spindle servo 41, which controls the spindle motor 40 so that the optical disc 1 rotates at a constant linear velocity. The spindle servo 41 performs the constant linear velocity control of the spindle motor 40 in accordance with, for example, the wobble signal.

The data recording device 500 includes a RF amp 50 and a decoder 51 to read the information recorded in the optical disc 1, such as the wobble signal. The RF amp 50 generates a binary digital signal from the reflection light received by the optical head 30. The decoder 51 decodes the digital signal of the RF amp 50 to generate the wobble signal. In accordance with the wobble signal, the spindle servo 41 controls the spindle motor 40 at a constant linear velocity.

The data recording device 500 synchronizes the system clock signal CLK with the LPP signal to record data following slight changes in the rotation of the optical disc 1. The encoder 10 uses the system clock signal CLK to obtain the timing for outputting data to the laser drive circuit 20.

Since the LPP signal has a cycle that is 16 times longer than that of the wobble signal, the synchronization of the system clock signal CLK with the LPP signal is difficult. Further, the LPPs formed on the optical disc 1 may not be detected when recording data. This makes it further difficult to synchronize the clock signal with the LPP signal.

The data recording device 500 generates the system clock signal CLK by first approximating the synchronization of the system clock signal CLK and the wobble signal and then adjusting the phase of the system clock signal CLK in accordance with the LPP signal. Thus, the system clock signal CLK is accurately synchronized with the rotation of the disc 1.

The PLL circuit of the data recording device 500 includes a first loop (circuit) L1 and a second loop (circuit) L2. The first loop L1 generates a first clock signal CLK1 which is synchronized with the wobble signal. The second loop L2 generates the system (second) clock signal CLK (CLK2) which is synchronized with the LPP signal. More specifically, a divisional clock signal (DCK1) of the first clock signal CLK1 generated by the first loop L1 is frequency-synchronized with the wobble signal. A divisional clock signal (DCK2) of the system clock signal CLK generated by the second loop L2 is phase-synchronized with the LPP signal. Frequency-synchronized refers to a state in which the frequencies of two signals are generally matched. Phase-synchronized refers to a state in which the phases of two signals are generally matched.

The first loop L1 includes a voltage-controller oscillator (VCO) 132, which supplies the second loop L2 with a first control voltage Va. The second loop L2 includes a second VCO 162, which generates a control voltage. The control voltage of the second VCO 162 is a signal generated by synthesizing the first control voltage Va with a second control voltage Vb, which is generated from the difference between the phase of a divisional signal of the clock signal CLK (second divisional clock signal DCK2), which is generated by the second VCO 162, and the phase of the LPP signal.

In the first loop L1, the leading and trailing edges of the pulses of a divisional signal of the clock signal generated by the first VCO 132 (first divisional signal) are compared with the leading and trailing edges of the pulses of the wobble signal. The first VCO 132 is controlled based on the comparison.

The RF amp 50 binary-codes the wobble signal read from the optical disc 1 to generate a binary-coded wobble signal. The duty ratio of the binary-coded wobble signal varies. Thus, changes in the duty ratio of the binary-coded wobble may affect the first VCO 132, which is controlled in accordance with the phase and frequency differences between the clock signal generated by the first loop L1 and the wobble signal.

Figure 3:
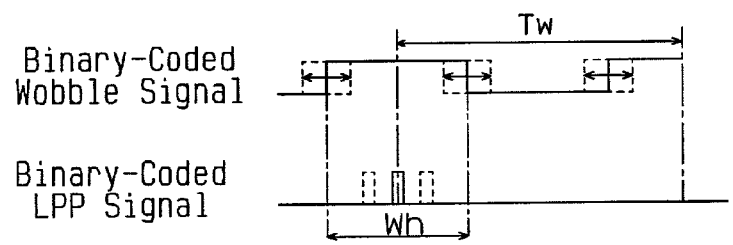
FIG. 3 is a enlarged chart illustrating the waveforms of a wobble signal and an LPP signal of FIG. 2.

Referring to FIG. 3, the binary-coded wobble signal has a cycle Tw (the time between the centers of adjacent pulses) and a phase that are maintained even if its pulse width Wh changes. Accordingly, to prevent the first VCO 132 from being affected by changes in the duty ratio, the first VCO 132 is controlled based on the cycle Tw and phase of the binary-coded wobble signal and the cycle and phase of the first clock signal generated by the first VCO 132. To compare the cycles and phases of the binary-coded wobble signal and the first clock signal, the data recording device 500 compares the leading and trailing edges of the binary-coded wobble signal and the first clock signal CLK1.

Figure 2:
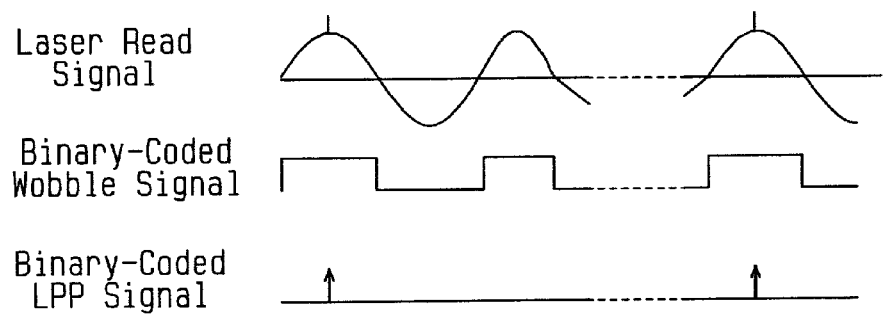
FIG. 2 is a chart illustrating the waveforms of a wobble signal and an LPP signal of the data recording device of FIG. 1.

Referring to FIG. 2, the RF amp 50 binary-codes the LPP signal to generate a binary-coded LPP signal. The phase of the binary-coded LPP signal may not be synchronized with the phase of the binary-coded wobble signal as shown by the broken lines in FIG. 3. Accordingly, after generating the clock signal CLK, which is generally synchronized with the wobble signal, the data recording device 500 phase-synchronizes the clock signal CLK with the binary-coded LPP signal.

The system clock signal generation circuit (PLL circuit) 100 of the data recording device 500 will now be discussed. Referring to FIG. 1, the system clock signal generation circuit 100 includes the first loop L1, the second loop L2, a command circuit 265, and an LPP output circuit 164.

In the system clock signal generation circuit 100, the first loop L1 generates the first clock signal CLK1, which is frequency synchronized with the binary-coded wobble signal. First, a leading edge comparator (first phase comparator) 110a compares the leading edges of the binary-coded wobble signal and the first clock signal CLK1 to generate a leading edge comparison signal (first comparison signal). A trailing edge comparator (first phase comparator) 110b compares the trailing edges of the binary-coded wobble signal and the first clock signal CLK1 to generate a trailing edge comparison signal (first comparison signal).

A first charge pump 120a receives the leading edge comparison signal and generates a first charge pump signal in accordance with the leading edge comparison signal. A second charge pump 120b receives the trailing edge comparison signal and generates a second charge pump signal in accordance with the trailing edge comparison signal. The first and second charge pump signals are provided to a first adder 130. The first adder 130 synthesizes the first and second charge pump signals to generate a first sum signal.

The first sum signal is provided to a first low-pass filter 131. The first low-pass filter 131 smoothens the first sum signal to generate the first control voltage Va. The first control voltage Va is supplied to the first VCO 132.

The first VCO 132 generates the first clock signal CLK1 in accordance with the first control voltage Va. The first clock signal CLK1 is provided to a frequency divider 133. The frequency divider 133 divides the first clock signal CLK1 by a predetermined frequency dividing ratio to generate a first divisional signal. The first divisional signal is provided to the leading edge comparator 110a and the trailing edge comparator 110b. As a result, the first clock signal CLK1 is frequency-synchronized with the wobble signal. The frequency dividing ratio of the frequency divider 133 is, for example, 1/372, and the first clock signal CLK1 has a frequency of 52.32 MHz.

Figure 4:
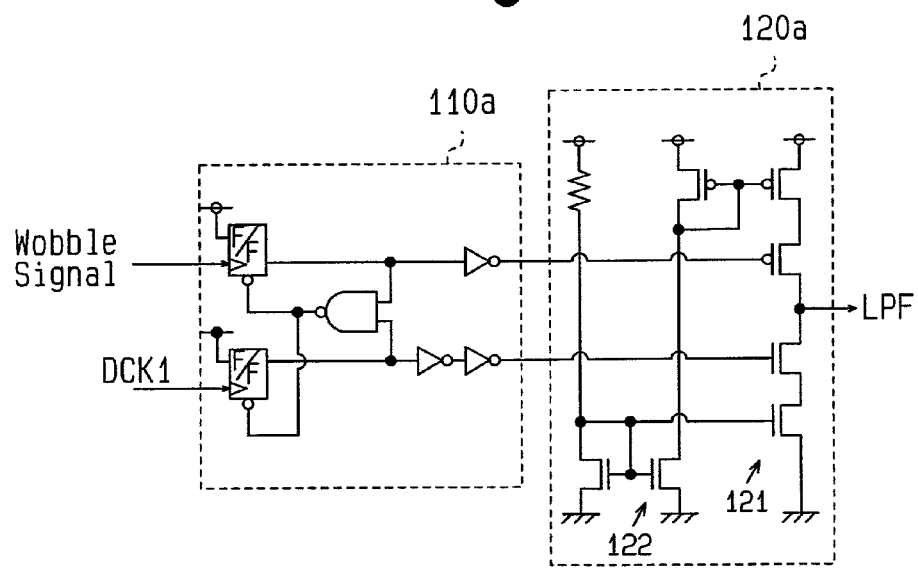
FIG. 4 is a schematic circuit diagram of a leading edge comparator and a charge pimp of the PLL circuit of FIG. 1.

The leading edge comparator 110a and the charge pump 120a are configured, for example, a shown in FIG. 4. The first charge pump 120a generates a predetermined first charge pump signal in accordance with the leading edge comparison signal of the leading edge comparator 110a from when one of the binary-coded wobble signal and the first divisional signal (first clock signal CLK1) goes high to when the other one of the binary-coded wobble signal and the first divisional signal goes high.

The binary-coded wobble signal and the first frequency dividing signal are provided to different flip-flops. Each flip-flop generates a high signal when the received signal goes high. Further, when the binary-coded wobble signal and the first divisional signal, which are provided to the two flip-flops, both go high, the two flip-flops are reset. This stops the output of the first charge pump signal from the first charge pump 120a.

The configurations of the trailing edge comparator 110b and the second charge pump 120b are identical to the leading edge comparator 110a and the first charge pump 120a. Referring to FIG. 1, the trailing edge comparator 110b is provided with an inverted binary-coded wobble signal and an inverted first divisional signal.

Figure 5:
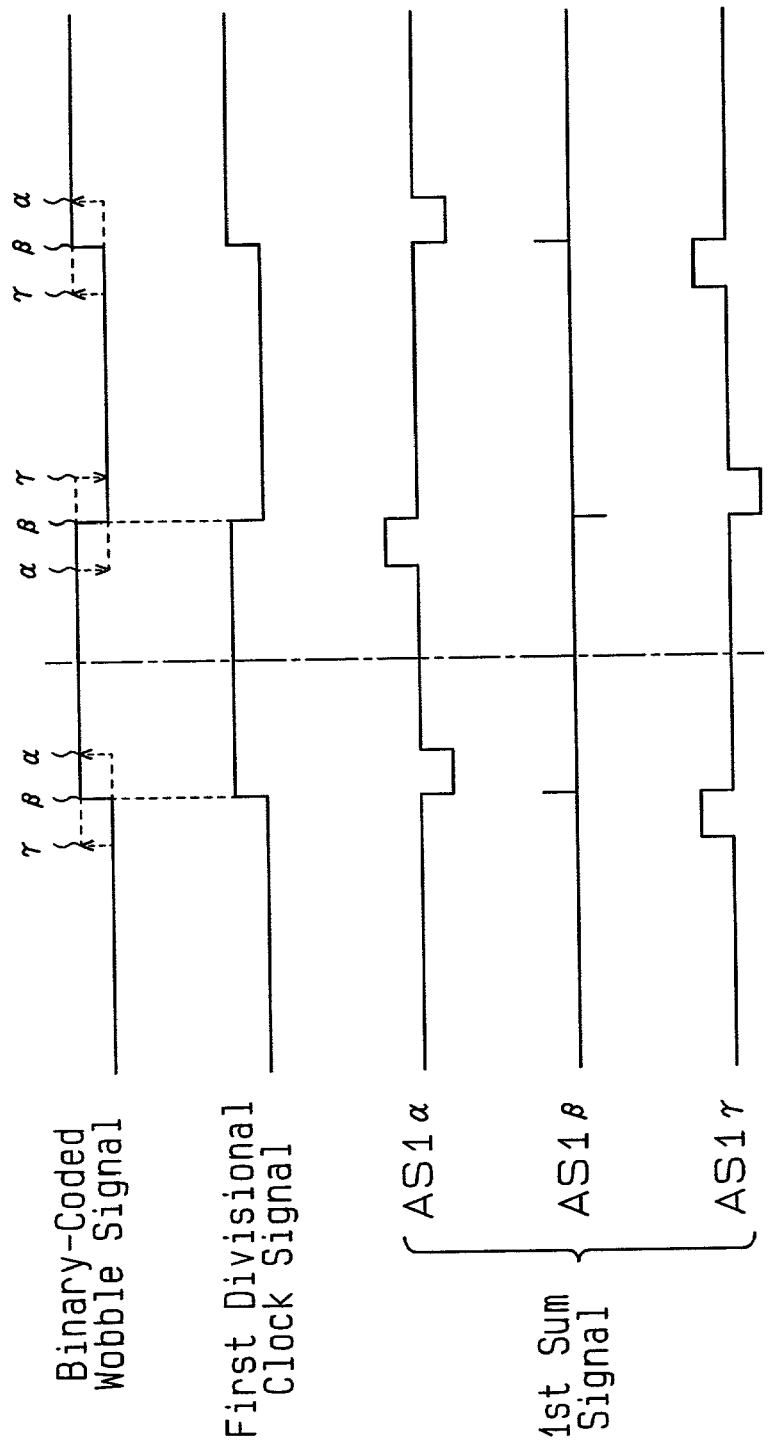
FIG. 5 is a time chart illustrating the operation of the PLL circuit of FIG. 1.

FIG. 5 illustrates the relationship between the output of the adder 130 (first sum signal) and the binary-coded wobble signal and first divisional clock signal DCK1. As shown in FIG. 5, when the leading and trailing edges of the first divisional clock signal DCK1 are synchronized with the leading and trailing edges of the binary-coded wobble signal (as indicated by β in FIG. 5), a first sum signal AS1β is substantially zero.

When the pulse width of the binary-coded wobble signal is narrower than that of the first divisional clock signal DCK1 (as indicated by α in FIG. 5), the adder 130 generates a first sum signal AS1α at a low potential from when the first divisional clock signal DCK1 goes high to when the binary-coded wobble signal goes high and performs a discharge operation. Further, the adder 130 generates the first sum signal AS1α at a high potential from when the binary-coded wobble signal goes low to when the first divisional clock signal DCK1 goes low and performs a charge operation.

Further, when the pulse width of the binary-coded wobble signal is wider than that of the first divisional clock signal DCK1 (as indicated by γ in FIG. 5), the adder 130 generates a first sum signal AS1γ at a high potential from when the binary-coded wobble signal goes high to when the first divisional clock signal DCK1 goes high and performs a charge operation. Further, the adder 130 generates the first sum signal AS1γ at a low potential from when the first divisional clock signal DCK1 goes low to when the binary-coded wobble signal goes low and performs a discharge operation.

When the pulse centers of the binary-coded signal and the first divisional clock signal DCK1 are synchronized, the charge current and discharge current in the first and second charge pumps 120a, 120b are the same. Accordingly, the first loop L1 synchronizes the pulse centers of the binary-coded wobble signal and the first divisional clock signal DCK1 regardless of the difference between the pulse widths of the binary-coded wobble signal and the first divisional clock signal DCK1.

Referring to FIG. 4, the charge pump 120a includes a bias circuit 122 and an output circuit 121. The output circuit 121 generates a first charge pump signal at a high potential when the binary-coded wobble signal goes high before the first divisional clock signal DCK1 and performs a charge operation. The output circuit 121 generates a first charge pump signal at a low potential when the first divisional clock signal DCK1 goes high before the binary-coded wobble signal goes high and performs a discharge operation.

The bias circuit 122 adjusts the first charge pump signal. In the first charge pump 120a, the charge current and discharge current of the first low-pass filter 131 are the same.

The second loop L2, which generates the system clock signal (second clock signal) CLK phase-synchronized with the binary-coded LPP signal, will now be discussed.

The second loop L2 generates the clock signal CLK frequency-synchronized with the binary-coded wobble signal in accordance with the first control voltage Va of the first VCO 132 of the first loop L1 and finely adjusts the clock signal CLK in accordance with the binary-coded LPP signal. Further, in the first embodiment, the system clock signal generation circuit 100 predicts the detection timing of the binary-coded LPP signal. This prevents noise from being erroneously detected as the LPP signal. Thus, the feedback control of the second loop L2 is not affected by noise.

Referring to FIG. 1, the system clock signal generation circuit 100 distinguishes the binary-coded LPP signal, which is received from the decoder 51, and noise. When the recording of data is started, the command circuit 165 holds the time when the LPP signal is detected for the first time. The command circuit 165 assumes the time from when the LPP signal is detected to when the next LPP signal is detected by, for example, counting the system clock signal CLK. The command circuit 165 generates a window pulse every predetermined cycle in synchronism with the assumed detection time. The window pulse has a pulse width that covers the time during which the binary-coded LPP signal is detected. The window pulse is provided to the LPP output circuit 164.

The LPP output circuit 164 provides the binary-coded LPP signal to a second (phase) comparator 140 of the second loop L2 only when the binary-coded LPP signal is detected during the period the window pulse is provided. Thus, noise is not erroneously detected as the binary-coded LPP signal.

The second comparator 140 compares the binary-coded LPP signal with a second divisional clock signal DCK2, which is generated by a frequency divider 163 that divides the frequency of the system clock signal CLK, to generate a comparison signal (second comparison signal). The comparison signal is provided to a charge pump 150. The charge pump 150 converts the comparison signal to a signal having a predetermined level and generates a charge pump signal. The charge pump signal is provided to a second low-pass filter 160. The second low-pass filter 160 smoothens the charge pump signal to generate a second control voltage Vb.

The second control voltage Vb is provided to a second adder 161. The second adder 161 adds the first control voltage Va and the second control voltage Vb to generate a sum voltage (second sum signal). The sum voltage is provided to the second VCO 162.

The frequency dividing ratio of the second frequency divider is 1/5952, and the frequency of the system clock signal CLK is the same as that of the first clock signal CLK1 (52.32 MHz). The second VCO 162 has the same configuration as the first VCO 132.

The second loop L2 synchronizes the leading edge of the second divisional clock signal DCK2 (system clock signal CLK) with the pulse center of the binary-coded LPP signal, which is provided to the second comparator 140.

Figure 6:
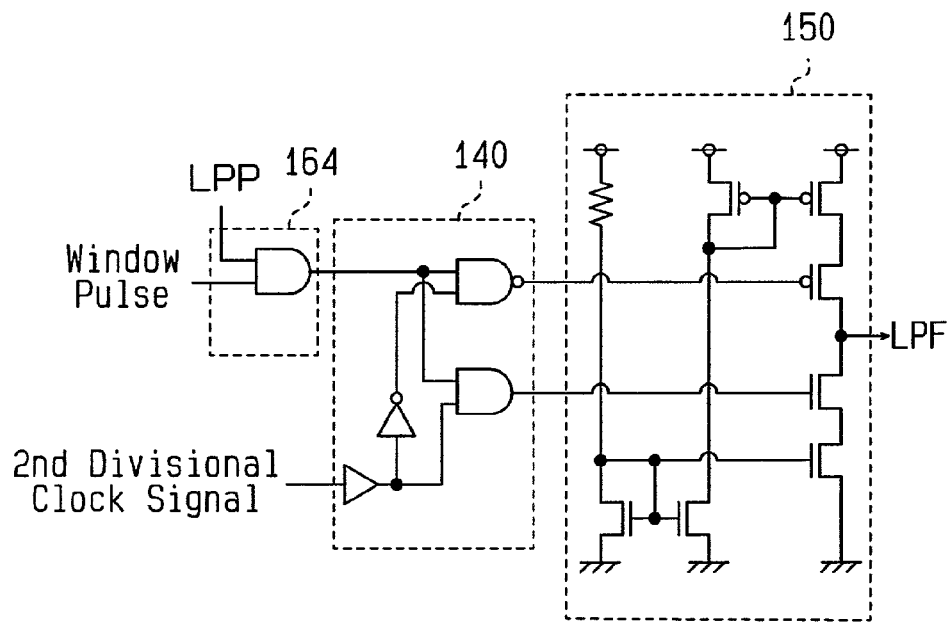
FIG. 6 is a schematic circuit diagram of a phase comparator and the charge pump of the PLL circuit of FIG. 1.
Figure 7:
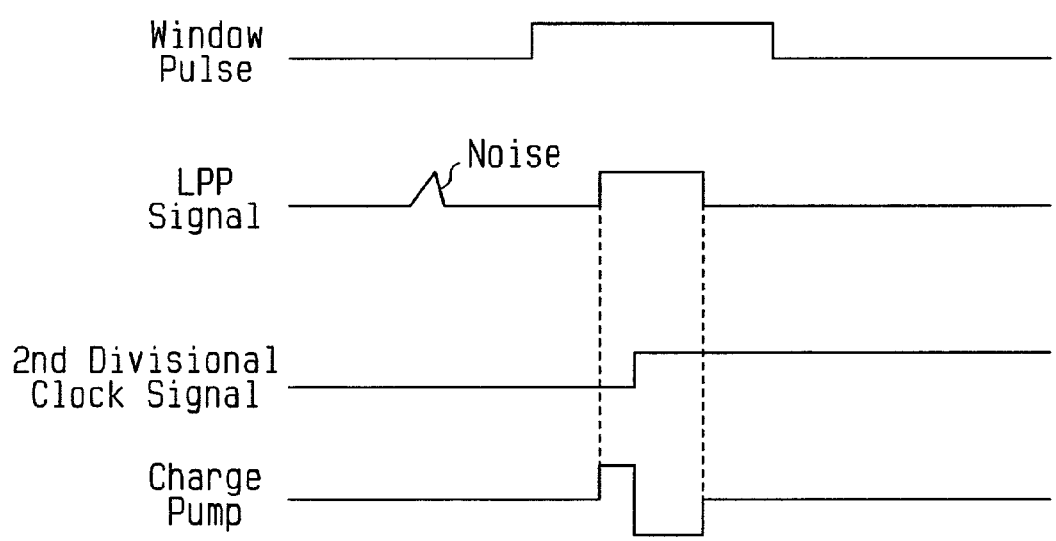
FIG. 7 is a time chart illustrating the operation of the PLL circuit of FIG. 1.

FIG. 6 is a schematic circuit diagram showing the LPP output circuit 164, the second comparator 140, and the charge pump 150. FIG. 7 is a time chart of the window pulse, which is provided to the second comparator 140, the binary-coded LPP signal, the second divisional clock signal DCK2, and the charge pump signal, which is output from the charge pump 150.

Referring to FIG. 7, when the window pulse is not provided, the LPP output circuit 164 does not provide the binary-coded LPP signal to the second comparator 140 even when noise is mixed with the binary-coded LPP signal. When the window pulse is provided, the LPP output circuit 164 provides the binary-coded LPP signal to the second comparator 140.

Therefore, the charge pump 150 generates a charge pump signal at a high potential during the period from when the second comparator 140 is provided with the binary-coded LPP signal to when the second divisional clock signal DCK2 goes high. When the second comparator 140 is provided with the binary-coded LPP signal while the second divisional clock signal DCK2 is high, the charge pump 150 generates the charge pump signal at a low potential.

The charge pump 150 equalizes the charge current and discharge current of the second low-pass filter 160. More specifically, the charge pump 150 equalizes the charge time and the discharge time when the leading edge of the second divisional signal DCK2 is synchronized with the center of the pulses of the LPP signal. In response to the charge pump signal, the second VCO 162 synchronizes the leading edge of the second divisional clock signal DCK2 with the center of the pulses of the LPP signal.

In the first embodiment, the second VCO 162 is controlled based on the sum voltage, which is the sum of the first control voltage Va that controls the first VCO 132 and the second control voltage Vb. That is, after controlling the synchronization of the system clock signal CLK based on the wobble signal, which is easily synchronized with, the system clock signal CLK is finely adjusted in accordance with the LPP signal. Thus, the system clock signal CLK is generated in accordance with the LPP signal, which has a relatively low frequency.

The system clock signal generation circuit (PLL circuit) 100 of the first embodiment has the advantages discussed below.

(1) The second VCO 162 of the PLL circuit 100 generates the system clock signal CLK (CLK2) in accordance with the first control voltage Va and the second control voltage Vb. The first VCO 132 generates the first clock signal CLK1, which is synchronized with the binary-coded wobble signal, in accordance with the first control voltage Va. The second control voltage Vb is generated in accordance with the phase difference between the binary-coded LPP signal and the second divisional clock signal DCK2. Accordingly, the system clock signal CLK is generated in accordance with the binary-coded LPP signal, which has a relatively low frequency.

(2) The command circuit 165 of the PLL circuit 100 predicts the time the binary-coded LPP signal is detected and permits the second comparator 140 to perform processing only during the predicted period. Thus, noise is not erroneously recognized as the binary-coded LPP signal.

(3) The leading edge comparator 110a compares the leading edges of the binary-coded wobble signal and the first divisional clock signal DCK1. The trailing edge comparator 110b compares the trailing edges of the binary-coded wobble signal and the first divisional clock signal DCK1. Thus, the VCO 132 is not affected by changes in the duty ratio of the reproduced binary-coded wobble signal.

[Second Embodiment]

Figure 8:
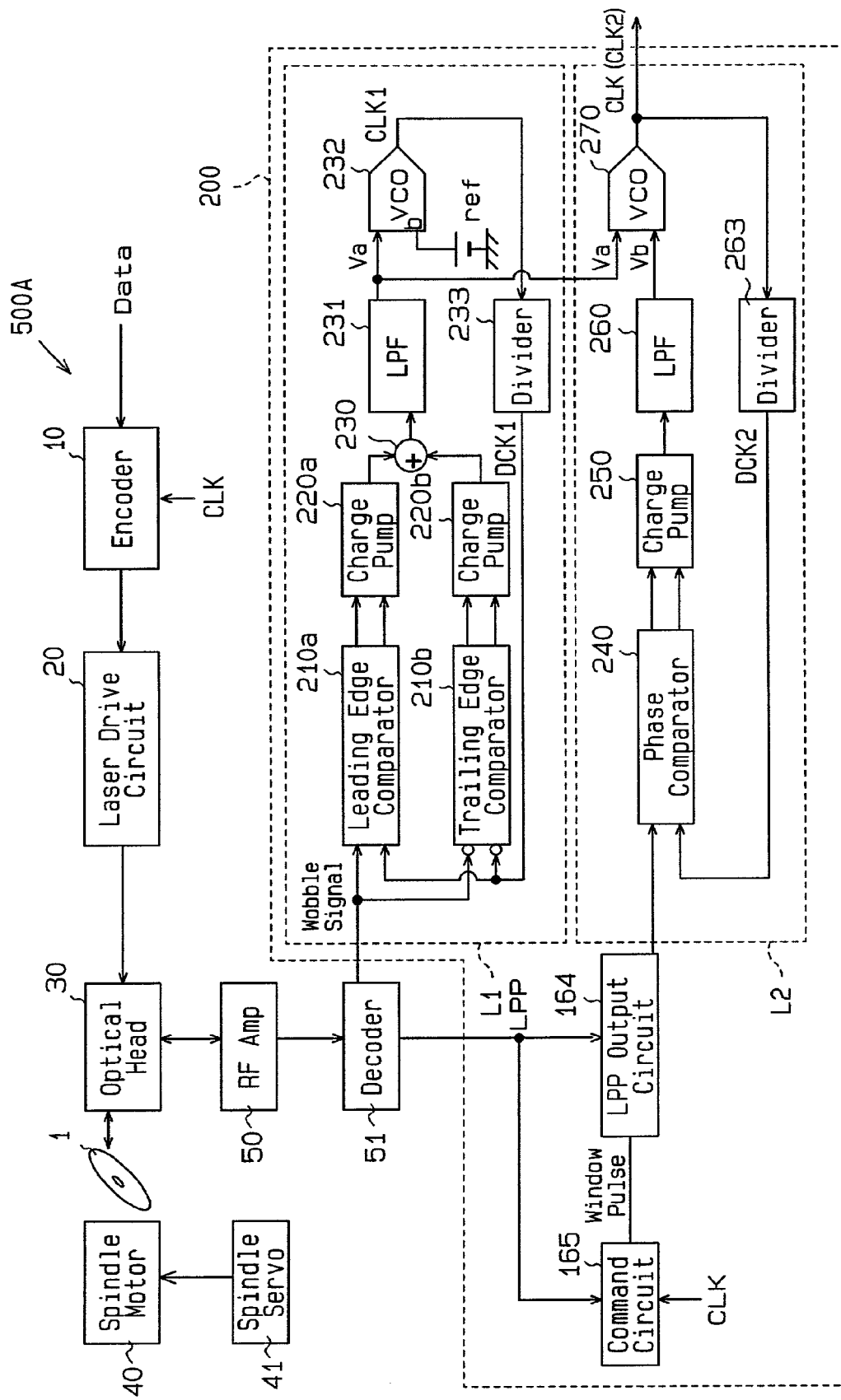
FIG. 8 is a schematic block diagram of an optical disc data recording device including a PLL circuit according to a second embodiment of the present invention.

FIG. 8 is a schematic block diagram of an optical disc (DVD-R) data recording device 500A that includes a PLL circuit according to a second embodiment of the present invention. The PLL circuit is applied to a system clock signal generation circuit 200 of the data recording device 500A.

In the second embodiment, a second VCO 270 directly receives the first control voltage Va and the second control voltage Vb without using the second adder 161 of FIG. 1. More specifically, the second VCO 270 receives the first control voltage Va via a first input terminal ITa and the second control voltage Vb via the second input terminal ITb.

Figure 9:
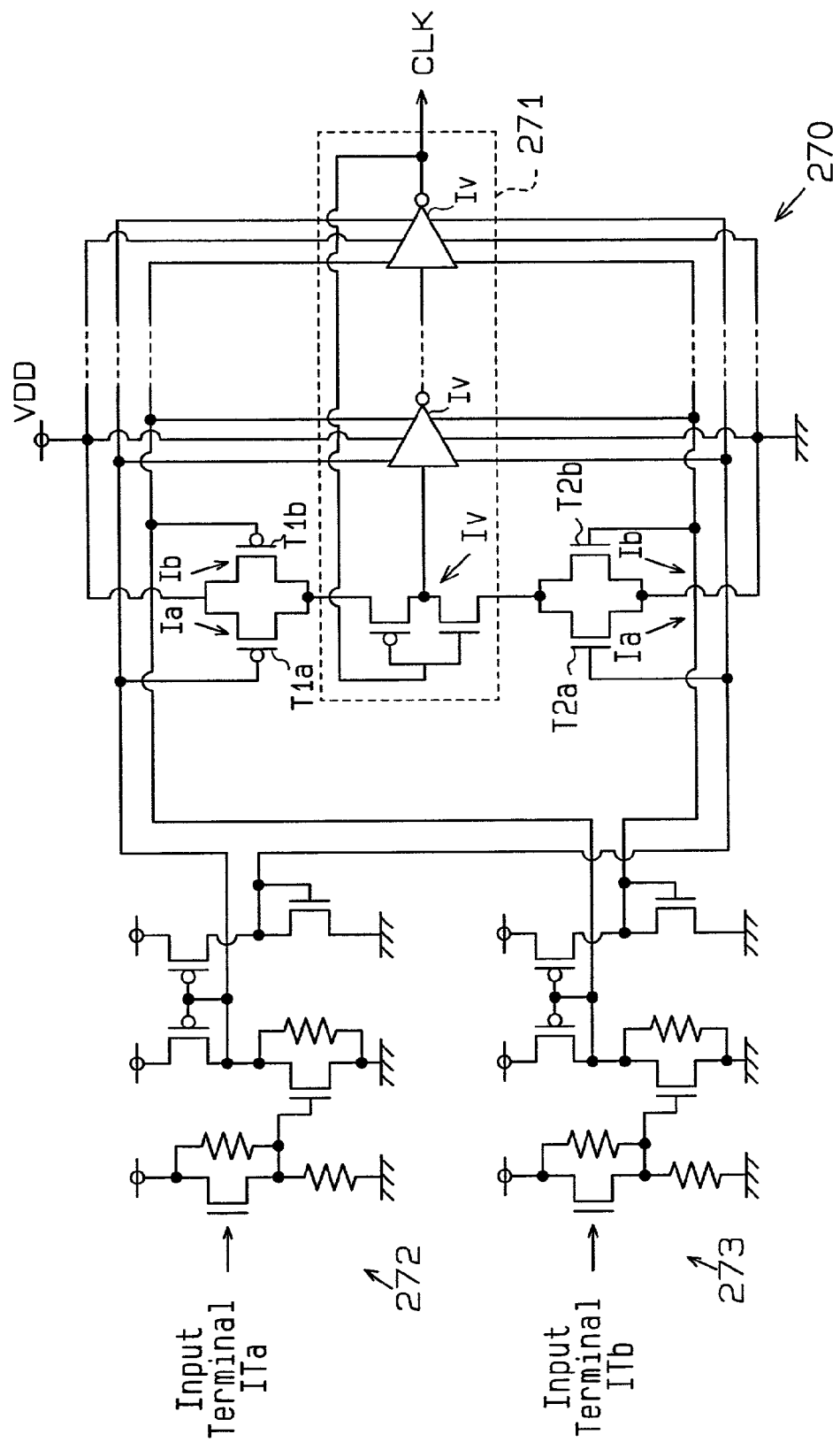
FIG. 9 is a schematic circuit diagram of a VCO of the PLL circuit of FIG. 8.

With reference to FIG. 9, the second VCO 270 includes a ring oscillator 271, which has an odd number of inverters Iv. Each inverter Iv is connected between a power supply VDD and the ground. The first control voltage Va and the second control voltage Vb controls the power generated by the power supply VDD.

More specifically, the first control voltage Va controls a p-channel transistor T1a (first current control gate) and an n-channel transistor T2a (first current control gate) and the current (drive current) Ia that flows between each inverter Iv and the power supply VDD and between each inverter Iv and the ground. The second control voltage Vb controls a p-channel transistor T1b (second current control gate) and an n-channel transistor T2b (second current control gate) and the current (drive current) Ib that flows between each inverter Iv and the power supply VDD and between each inverter Iv and the ground.

The output signal (system clock signal CLK) of the ring oscillator 271 has a frequency that is proportional to the current amount Ia+Ib flowing through each inverter Iv. Thus, the system clock signal CLK is adjusted in accordance with the first control voltage Va and the second control voltage Vb.

When adjusting the frequency of the system clock signal CLK, the first control voltage Va is supplied to a first bias circuit 272, the second control voltage Vb is supplied to a second bias circuit 273, and the first and second control voltages Va, Vb are each converted to a predetermined signal. The first bias circuit 272 converts the level of the first control voltage and generates a control voltage, which is supplied to the gate terminals of transistors T1b and T2b via a current mirror circuit.

The ring oscillator 271 performs broadband control in response to the first control voltage Va and narrowband control in response to the second control voltage Vb. In this state, the controlled current amount that flows between the power supply and the ring oscillator 271 or between the ring oscillator 271 and the ground is greater when controlled by the first control voltage Va than when controlled by the second control voltage Vb. More specifically, the size of the transistors T1a and T2a, which are controlled by the first control voltage Va, is greater than the size of the transistors T1b and T2b, which are controlled by the second control voltage Vb.

FIGS. 10A and 10B are graphs illustrating the output characteristics of the second VCO 270. As shown in FIG. 10A, the frequency of the output signal (system clock signal CLK) of the second VCO 270 changes significantly in accordance with the first control voltage Va. In comparison, referring to FIG. 10B, the second control voltage Vb finely adjusts the frequency of the system clock signal CLK.

Accordingly, referring to FIGS. 10A and 10B, for example, the first control voltage Va is set at V0, and the system clock signal CLK is controlled generally at the desired frequency. Afterward, the second control voltage Vb finely adjusts the system clock signal CLK.

Referring to FIG. 8, the first control voltage Va is a control signal for synchronizing the system clock signal CLK with the binary-coded wobble signal. The second control voltage Vb is a control signal for synchronizing the system clock signal CLK with the binary-coded LPP signal. Thus, the system clock signal CLK is quickly controlled to the frequency band of the binary-coded wobble signal and finely adjusted in accordance with the binary-coded LPP signal.

A first VCO 232 of the first loop L1, which generates a first clock signal that is frequency-synchronized with the binary-coded wobble signal, has the same configuration as the second VCO 270 of the second loop L2. Thus, when the output signal (first clock signal) of the first VCO 232 is synchronized with the binary-coded wobble signal, the system clock signal CLK is synchronized with the binary-coded wobble signal in accordance with the first control voltage Va. The input terminal (fourth input terminal) ITb of the first VCO 232 always receives a constant reference voltage.

In the two loops A, B, the data recording device 500A adjusts the gain of charge pumps 220a, 220b, 250 to optimize the feedback cycle. More specifically, the gain of the charge pumps 220a, 220b, which generate the first control voltage Va, is set at a value lower than the gain of the charge pump 250, which generates the second control voltage Vb. When the frequency of the binary-coded LPP signal is higher than that of the binary-coded wobble signal, the feedback control cycle of the first loop L1 is shorter than the feedback cycle of the second loop L2.

The gains of the loops A, B are basically adjusted by optimally setting each transistor of the charge pumps 220a, 220b and each transistor of the charge pump 250. The configurations of the charge pumps 220a, 220b are similar to the configurations of the charge pumps 120a, 120b of FIG. 4, and the configuration of the charge pump 250 is similar to the configuration of the charge pump 150 of FIG. 4.

In addition to advantages (1) to (3) of the first embodiment, the system clock signal generation circuit (PLL circuit) 200 of the second embodiment has the advantages described below.

(4) The second VCO 270 is controlled based on the broad band first control voltage Va and the narrow band second control voltage Vb. Thus, the generated system clock signal CLK is stable and accurately reflects the LPP signal.

(5) The gains of the charge pumps 220a, 220b of the first loop L1 is lower than the gain of the charge pump 250 of the second loop L2. This optimizes the feedback cycle of the first loop L1 and the second loop L2.

It should be apparent to those skilled in the art that the present invention may be embodied in many other specific forms without departing from the spirit or scope of the invention. Particularly, it should be understood that the present invention may be embodied in the following forms.

In the second embodiment, the gain of the PLL circuit 200 may be adjusted using the first and second bias circuits 272, 273 of FIG. 9. Further, the gains of the first loop L1 and the second loop L2 may be optimized by optimally adjusting the gains of the charge pumps 220a, 220b, 250 and the gains of the bias circuits 272, 273.

In the second embodiment, the first and second bias circuits 272, 273 of FIG. 9 may be deleted if the input control voltages Va, Vb are optimally set.

In the second embodiment, a variable resistor may control the current flowing between the power supply and the ring oscillator and between ring oscillator and the ground.

In the second embodiment, the current supplied to some of the inverters of the ring oscillator may be variably controlled.

In the second embodiment, the ring oscillator may have a delay circuit for variably controlling a delay amount with the supplied current amount, and the delay circuit may have an odd number of inverter at its input side or output side.

When comparing the binary-coded signal and the first divisional clock signal DCK1 in the first loop L1, only the leading edges of the binary-coded wobble signal and the first divisional signal DCK1 may be compared. Further, in a circuit such as that shown in FIG. 6, the edges of the divisional clock signals of the frequency dividers 163, 263 may be controlled to that they are synchronized with the pulse centers of the binary-coded wobble signal.

When noise is not erroneously detected as the LPP signal, the command circuit 165 of FIGS. 1 and 8 need not generate the window pulse.

The configuration of the first VCOs 132, 232 of the first loop L1 may differ from the configurations of the second VCOs 162, 270 of the second loop L2. In this case, the first control voltage Va is varied taking into consideration the amount the first control voltage Va changes the system clock signal CLK.

The PLL circuit of the present invention may be applied to a system clock signal generation circuit of a data recording device for optical discs, such as a compact disc-recordable (CD-R), a magneto-optic (MO) disc, or a mini disc (MD).

The application of the PLL circuit of the present invention is effective when the generation of a phase-synchronized clock signal using a signal, which has a relatively low frequency and which is difficult to synchronize with.

The present examples and embodiments are to be considered as illustrative and not restrictive, and the invention is not to be limited to the details given herein, but may be modified within the scope and equivalence of the appended claims.

What is claimed is:

1. A phase-locked loop (PLL) circuit comprising:
a first loop circuit for generating a first clock signal which is synchronized with a first reference signal, wherein the first reference signal is compared with the first clock signal to generate a first control voltage; and
a second loop circuit connected to the first loop circuit for generating a second clock signal which is synchronized with a second reference signal having a frequency which is sufficiently lower than the frequency of the first reference signal, wherein the second reference signal is compared with the second clock signal to generate a second control voltage;
wherein the first loop circuit includes a first voltage controlled oscillator for generating the first clock signal in accordance with the first control voltage and a first phase comparator for receiving the first reference signal and a first divisional clock signal, which is generated by dividing the first clock signal, and generating a first comparison signal in accordance with the first reference signal and the first divisional clock signal;
wherein the second loop circuit includes a second voltage controlled oscillator for generating the second clock signal in accordance with the first control voltage and the second control voltage; and
wherein the first phase comparator includes:
a leading edge comparator connected to the first frequency divider for receiving the first reference signal and the first divisional clock signal and generating a leading edge comparison signal in accordance with the difference between the timing of the leading edge of the first reference signal and the timing of the leading edge of the first divisional clock signal;
a trailing edge comparator connected to the first frequency divider for receiving the first reference signal and the first divisional clock signal and generating a trailing edge comparison signal in accordance with the difference between the timing of the trailing edge of the first reference signal and the timing of the trailing edge of the first divisional clock signal; and
an adder connected to the leading edge comparator and the trailing edge comparator for generating a sum signal by adding the leading edge comparison signal and the trailing edge comparison signal.

2. The PLL circuit according to claim 1, wherein the second loop circuit further includes an adder connected to the second voltage controlled oscillator for generating a sum voltage by adding the first control voltage and the second control voltage.

3. The PLL circuit according to claim 1, wherein the first reference signal is a wobble signal of an optical disc, and the second reference signal is a land prepit signal of the optical disc.

4. A phase-locked loop (PLL) circuit comprising:
a first loop circuit for generating a first clock signal which is synchronized with a first reference signal; and
a second loop circuit connected to the first loop circuit for generating a second clock signal which is synchronized with a second reference signal, wherein the frequency of the second reference signal is lower than the frequency of the first reference signal;
wherein the first loop circuit includes:
a first frequency divider for generating a first divisional clock signal by dividing the first clock signal by a predetermined first frequency dividing ratio;
a first phase comparator connected to the first frequency divider for receiving the first reference signal and the first divisional clock signal and generating a first comparison signal in accordance with the first reference signal and the first divisional clock signal;
a first low-pass filter connected to the first phase comparator for generating a first control voltage corresponding to the first comparison signal; and
a first voltage controlled oscillator connected to the first low-pass filter for generating the first clock signal in accordance with the first control voltage;

wherein the second loop includes:
  a second frequency divider for generating a second divisional clock signal by dividing the second clock signal by a predetermined second frequency dividing ratio;
  a second phase comparator connected to the second frequency divider for receiving the second reference signal and the second divisional clock signal and generating a second comparison signal in accordance with the second reference signal and the second divisional clock signal;
  a second low-pass filter connected to the second phase comparator for generating a second control voltage corresponding to the second comparison signal; and
  a second voltage controlled oscillator connected to the first and second low-pass filters for generating the second clock signal in accordance with the first and second control voltages;
wherein the first phase comparator includes:
  a leading edge comparator connected to the first frequency divider for receiving the first reference signal and the first divisional clock signal and generating a leading edge comparison signal in accordance with the difference between the timing of the leading edge of the first reference signal and the timing of the leading edge of the first divisional clock signal;
  a trailing edge comparator connected to the first frequency divider for receiving the first reference signal and the first divisional clock signal and generating a trailing edge comparison signal in accordance with the difference between the timing of the trailing edge of the first reference signal and the timing of the trailing edge of the first divisional clock signal and an adder connected to the leading edge comparator and the trailing edge comparator for generating a sum signal by adding the leading edge comparison signal and the trailing edge comparison signal.

5. The PLL circuit according to claim 4; wherein the second voltage controlled oscillator includes:
  a first input terminal for receiving the first control voltage;
  a second input terminal for receiving the second control voltage; and
  a ring oscillator connected to the first and second input terminals and driven by differing first and second control currents respectively corresponding to the first and second control voltages.

6. The PLL circuit according to claim 5, wherein the second voltage controlled oscillator further includes:
  a first current control gate corresponding to the first input terminal; and
  a second current control gate corresponding to the second input terminal;
  wherein a drive current of the first current control gate is greater than a drive current of the second current control gate; and
  wherein the first voltage controlled oscillator includes:
  a third input terminal for receiving the first control voltage; and
  a fourth input terminal for receiving a constant DC voltage.

7. The PLL circuit according to claim 4, wherein the second loop circuit further includes:
  a charge pump connected to the second phase comparator for generating a charge pump signal that equalizes a charge time and a discharge time when a leading edge of the second divisional clock signal is synchronized with a pulse center of the second reference signal.

8. The PLL circuit according to claim 4, wherein the second loop circuit further includes an adder connected to the second voltage controlled oscillator for generating a sum voltage by adding the first control voltage and the second control voltage.

9. A method for generating a clock signal using a first phase-locked loop (PLL) circuit and a second PLL circuit connected to the first PLL circuit, wherein the first PLL circuit includes a first voltage controlled oscillator, and the second PLL circuit includes a second voltage controlled oscillator, the method comprising the steps of:
  generating a first clock signal which is synchronized with a first reference signal; and
  generating a second clock signal which is synchronized with a second reference signal, wherein the frequency of the second reference signal is lower than the frequency of the first reference signal;
  wherein the step of generating the first clock signal includes:
    generating a first control voltage by comparing the first reference signal and the first clock signal; and
    generating the first clock signal in accordance with the first control voltage using the first voltage controlled oscillator; and
  wherein the step of generating the second clock signal includes;
    generating a second control voltage by comparing the second reference signal and the second clock signal; and
  generating the second clock signal in accordance with the first control voltage and the second control voltage using the second voltage controlled oscillator; and
  wherein the step of generating the first clock signal includes:
  comparing a leading edge of the first reference signal and a leading edge of a first divisional clock signal, which is generated by dividing the first click signal, and generating a leading edge comparison signal in accordance with the difference between the timing of the leading edge of the first reference signal and the timing of the leading edge of the first divisional clock signal:
  comparing a trailing edge of the first reference signal and a trailing edge of the first divisional clock signal and generating a trailing edge comparison signal in accordance with the difference between the timing of the trailing edge of the first reference signal and the timing of the trailing edge of the first divisional clock signal; and
  adding the leading edge comparison signal and the trailing edge comparison signal and generating a sum signal.

10. The method according to claim 9, wherein the method for generating the second clock signal further includes adding the first control voltage and the second control voltage.

* * * * *